United States Patent
Lizotte (12) 
(10) Patent No.: US 6,229,194 B1
(45) Date of Patent: May 8, 2001

(54) PROCESS FOR FILLING DEEP TRENCHES WITH POLYSILICON AND OXIDE

(75) Inventor: Steven C. Lizotte, Long Beach, CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/481,045

(22) Filed: Jan. 11, 2000

Related U.S. Application Data (62) Division of application No. 09/114,546, filed on Jul. 13, 1998, now Pat. No. 6,054,365.

(51) Int. Cl.[7] .................................................. H01L 29/00
(52) U.S. Cl. ........................ 257/506; 257/233; 257/510; 136/249
(58) Field of Search .................. 257/290, 292, 257/293, 227, 113, 228, 233, 510, 520, 501, 343, 458, 506, 507, 508; 136/249; 438/424, 425, 426, 427, 428, 429, 430, 431, 435, 437

(56) References Cited

U.S. PATENT DOCUMENTS

| | | |
|---|---|---|
| 4,227,098 | 10/1980 | Brown et al. . |
| 4,390,790 | 6/1983 | Rodriguez . |
| 4,612,408 * | 9/1986 | Moddel et al. ...................... 136/244 |
| 4,690,729 | 9/1987 | Douglas . |
| 4,755,697 * | 7/1988 | Kinzer ................................. 307/570 |
| 4,777,387 * | 10/1988 | Collins ................................. 307/270 |
| 4,912,335 * | 3/1990 | Ehalt et al. .......................... 250/551 |
| 4,916,572 * | 4/1990 | Guajardo ............................. 361/91 |
| 4,924,344 * | 5/1990 | Guajardo ............................. 361/101 |
| 4,963,951 * | 10/1990 | Adler et al. .......................... 357/23.7 |
| 4,996,577 | 2/1991 | Kinzer . |
| 5,032,529 | 7/1991 | Beitman et al. . |
| 5,084,130 | 1/1992 | Yamazaki et al. . |
| 5,176,789 | 1/1993 | Yamazaki et al. . |
| 5,342,808 | 8/1994 | Brigham et al. . |
| 5,459,099 | 10/1995 | Hsu . |
| 5,474,949 | 12/1995 | Hirao et al. . |
| 5,512,774 * | 4/1996 | Nakagawa et al. .................. 257/501 |
| 5,549,762 | 8/1996 | Cantarini . |
| 5,658,472 | 8/1997 | Bartha et al. . |
| 5,886,374 * | 3/1999 | Sakamoto et al. ................... 257/292 |

* cited by examiner

*Primary Examiner*—Tom Thomas
*Assistant Examiner*—Shouxiang Hu
(74) *Attorney, Agent, or Firm*—Ostrolenk, Faber, Gerb & Soffen, LLP (57) ABSTRACT

A process for etching and filling a trench prevents the top opening of the trench from being closed off prior to the trench being completely filled. After a masking layer is deposited and patterned, the trench is etched and then the masking layer is removed. A first liner insulating layer is grown or deposited and is then etched anisotropically to remove the layer from the top surface of the substrate as well as from the top portion of the walls of the trench. A second, thinner liner layer is grown or deposited on the exposed portion of the walls of the trench to provide surface and edge protection. A polysilicon layer is then deposited to fill the trench and is planarized to remove the portion deposited on the top surface of the substrate. Alternatively, the thinner oxide liner can be omitted, and the polysilicon is removed by chemical mechanical polishing until the trench liner oxide appears on the top surface. An overlaying insulation layer is then deposited. A passivation layer may be subsequently deposited on the bottom surface. The process is particularly suited for etching and filling steps that leave a re-entrant profile at the top of the trench. The trench structure may provide dielectric isolation for the cells of a photovoltaic generator. An MOS-gated device may be integrated into the same chip and may be a lateral or vertical MOSFET or a lateral or vertical IGBT.

11 Claims, 11 Drawing Sheets

PROCESS FOR FILLING DEEP TRENCHES WITH POLYSILICON AND OXIDE

This is a division of application Ser. No. 09/114,546, filed Jul. 13, 1998, now U.S. Pat. No. 6,054,365.

BACKGROUND OF THE INVENTION

This invention relates to semiconductor devices and, more specifically, relates to a novel process for fabricating a trench structure for a device in which an array of planar cells are formed in a single silicon wafer and are dielectrically isolated from one another.

It is often desirable to fabricate a semiconductor device formed of large number of cells. Photovoltaic generators (PVG), for example, are well known and are commonly used for producing a control signal for a solid state relay. Such devices employ an LED which is energized by input terminals to irradiate the photosensitive surface of a spaced and insulated photovoltaic device. The output of the photovoltaic device may serve as the input to a switching device, such as a MOS-gated device, typically a power MOSFET or IGBT, which has load terminals which are switched "on" in response to the energization of the LED. The input and output terminals of the relay are isolated by the gap between the LED and the photovoltaic device. Commonly, the photovoltaic device consists of a large number of series-connected photovoltaic cells in order to produce a voltage sufficiently high to turn on the power switching device. Such devices are well known and are sold under the name "PVI" (photovoltaic isolator) by the International Rectifier Corporation of El Segundo, Calif., the assignee of the present invention.

The plural cell photogenerator can be made in many different ways. One known generator employs a stack or pile of photovoltaic cells as shown in U.S. Pat. Nos. 4,755,697 and 4,996,577, both to Daniel M. Kinzer. Other devices employ a planar array of cells which are junction isolated from one another and are connected in series at their surfaces. Still other devices are known in which individual cells disposed over the surface of a silicon chip are junction-isolated from one another or may be dielectrically isolated, as shown in U.S. Pat. Nos. 4,227,098 and 4,390,790. The prior art devices, however, have the drawback of being expensive to manufacture as well as having low manufacturing yields.

Alternatively, a planar array of photovoltaic generating cells are formed in a dielectrically bonded silicon wafer. A relatively thick "handle" wafer is oxide bonded to, as well as insulated from, a thin device wafer in which the junctions are formed, as shown in U.S. Pat. No. 5,549,762 to the present applicant. This device, however, requires a relatively expensive starting wafer.

It is therefore desirable to produce a photovoltaic generator that can be formed of a large number of insulated cells which can be connected in series to produce a turn-on signal for a power MOS-gated device but which is easily manufactured and integrated with the MOS-gated device using existing reliable processing equipment and techniques. More specifically, it is desirable to produce a photovoltaic generator comprised of planar photovoltaic generating cells formed in a single wafer in which the cells are dielectrically isolated by a trench structure in which the trenches are of a predefined depth and are filled with an insulating material to dielectrically insulate each of the cells. The fabrication process for such a device is described, for example, in U.S. application Serial No. (IR-1457), which is incorporated herein by reference.

During the fabrication of such a trench structure, however, the oxide or other dielectric material that is grown or deposited in the trench often is thicker at the upper portion of the trench than in the lower regions of the trench. As a result, the deposited or grown insulating material may pinch-off and close the upper opening of the trench while leaving a lower region in the trench unfilled. The gaps in the trench weaken the insulating properties of the trench and can produce devices with lower voltage ratings as well as poor mechanical properties. This problem is further exacerbated when the trench is etched with the upper part of the walls at a re-entrant angle which produces a "pinch-off" region in which the upper opening of the trench is closed off while leaving a lower region in the trench unfilled.

It is therefore desirable that the fabrication process for the device produce a trench structure in which the trench is completely filled.

BRIEF DESCRIPTION OF THE INVENTION

The present invention provides a novel process for the manufacture of a trench structure that is used to dielectrically isolate the respective cells of a multiple cell semiconductor device formed in a single wafer.

In accordance with the present invention, a masking layer is formed on the top surface of a silicon substrate and is photolithographically patterned and etched. A trench is then etched in the openings in the masking layer, and the masking layer is then removed. An oxide layer is then grown or deposited on the interior walls and on the bottom surface of the trench, and then a dry, anisotropic etch is carried out to remove the oxide from the upper surface of the substrate as well as remove the oxide from the walls of the top portion of the trench. The trench can then be filled with polysilicon. Alternatively, a second, thinner oxide layer can be grown or deposited on the substrate as well as on the trench walls to provide surface and edge protection, and the trench then filled with polysilicon. Any polysilicon that is deposited on the top surface of the substrate is then removed by chemical mechanical polishing.

Other process steps may then be carried out, such as the deposition, patterning and etching of an overlaying insulation layer as well as the deposition, patterning and etching of a conductive layer. Then, the back side of the silicon substrate may be removed until the bottom of the trench is approached or reached. The back side may then be further polished until the trench liner oxide appears on the bottom surface. An insulating passivation may then be deposited on the back surface of the substrate, and a beam support may be used to insure that the trenched, back etched wafer holds together.

In accordance with another aspect of the present invention, the trench is etched in the manner described above but with an opening that is narrower at the top surface than in the lower regions of the trench so that the walls of the trench angle inward at the top surface, namely a re-entrant surface profile. The subsequent dry etching of the first oxide layer also removes this re-entrant structure.

In accordance with the present invention, dielectrically isolated, planar photovoltaic generating cells, which include a trench structure fabricated in the manner described above, are formed in a single wafer and may be integrated with one or more power devices in the same wafer.

A plurality of N+ (or P+) diffusions are formed in a lightly doped P type (or N type) starting wafer and are each enclosed by a ring shaped P+ (or N+) contact diffusion. Individual planar and spaced cells or tubs are then formed by etching an array of intersecting trenches between the P+ (or N+) contact diffusions in the manner of the invention. The trenches extend through the thin device layer to a predefined depth and are then filled with dielectric layers and with polysilicon to dielectrically insulate each of the tubs as described above. The N+ top contact of each cell is connected to the P+ contact of an adjacent cell to connect each of a predetermined number of the cells in series.

The back side of the silicon is then ground off to the level of the bottom of the trenches and polished until the liner oxide is exposed, and an insulating oxide is grown on the back surface. A beam support may be used to insure that the trenched, ground wafer holds together.

An MOS-gated device may be integrated into the same chip as the photovoltaic generator structure in a trenched or an untrenched area of the wafer. The MOS-gated device, which may a lateral or vertical MOSFET or a lateral or vertical IGBT, is formed prior to the grinding of the back side of the wafer and may be formed prior to or subsequent to the formation of the photovoltaic generator cells or may be formed by some processing steps that are common with those of the photovoltaic generator cells.

Significantly, other devices can be integrated into other dielectrically isolated cells of the wafer. For example, MOS-gated devices such as MOSFETs, IGBTs, GTDs and the like can be formed in other isolated cells of the common wafer. Contact circuits can also be integrated in other isolated wells. The devices integrated in other wells can be lateral conductor devices, or even vertical conductor devices in which the cells containing vertical contactor devices will also contain a bottom contact.

Other features and advantages of the present invention will become apparent from the following description of the invention which refers to the accompanying drawings.

BRIEF DESCRIPTION OF THE DRAWINGS

The invention will now be described in greater detail in the following detail description with reference to the drawings in which.

DETAILED DESCRIPTION OF THE INVENTION

Figure 1A:
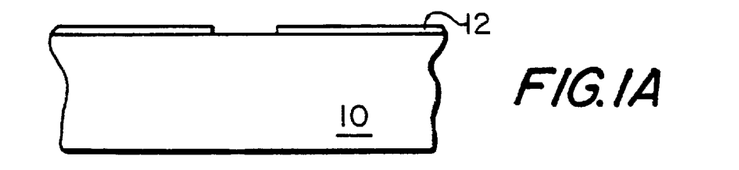
FIGS. 1A–1J show cross-sectional views of a portion of a device wafer in which a trench is etched and filled and in which the wafer is back-etched according t an aspect of the invention.

Referring first to FIG. 1A, there is shown a cross-sectional view of a portion of a silicon wafer substrate 10. The first step in the trench-formation process of the invention is the formation of a masking layer 12 atop the substrate 10. The masking layer 12, which may be thermally grown or deposited silicon dioxide, may have a thickness of about 14,000 angstroms, for example. Then, a photoresist layer (not shown) is deposited atop the masking layer and is patterned by an appropriate photolithographic masking step to form openings to the surface of the masking layer. The masking layer is then etched by a subsequent anisotropic etch which forms corresponding openings down to the silicon substrate.

Figure 1B:
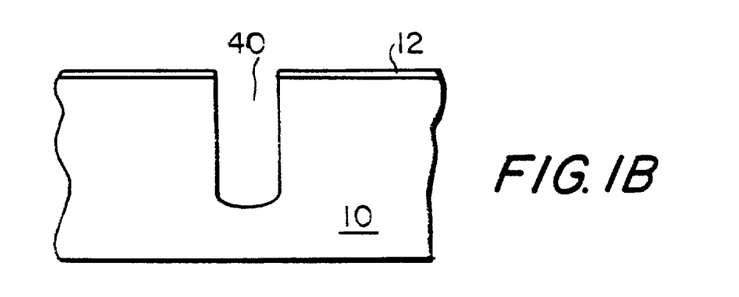
Figure 1C:
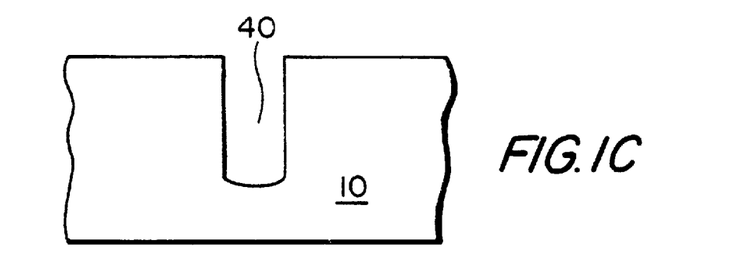

Thereafter, as FIG. 1B shows, a trench 40 is etched in the silicon substrate 10 to a depth of about 80 to 130 microns, for example. After the trench is etched, the masking layer is removed, as FIG. 1C shows. A very thin, sacrificial oxide may be grown on the walls of the trench prior to the removal of the masking layer to improve the trench side wall integrity by removing any damage caused during trench etching.

Figure 1D:
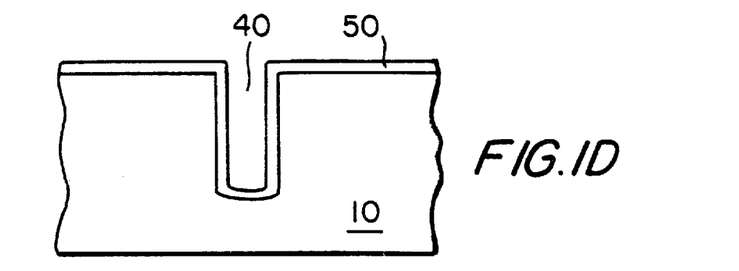
Figure 1E:
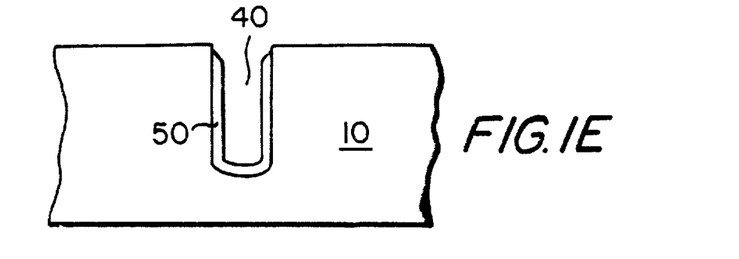

Then, a first liner oxide layer 50 is grown or deposited on the inner walls and on the bottom surface of the trench, as well as on the top surface of the substrate, to a thickness of, for example, about 3600 angstroms, as FIG. 1D shows. The liner oxide 50 is then anisotropically etched to clear the oxide from the top surface of the substrate and is then further etched to remove the liner oxide from the upper part of the walls of the trench, as FIG. 1E shows. The removal of the upper portion of the liner oxide prevents the formation of a re-entrant "pinch-off" region, namely, a "bird's beak" structure, at the upper portion of the trench during the subsequent polysilicon depositions. The "pinch-off" region can close off the top part of the opening in the trench and prevent the trench from being properly filled without forming a gap in the lower portion of the trench.

Figure 1F:
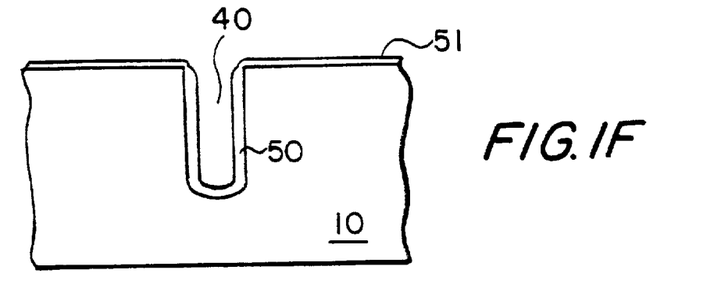
Figure 1G:
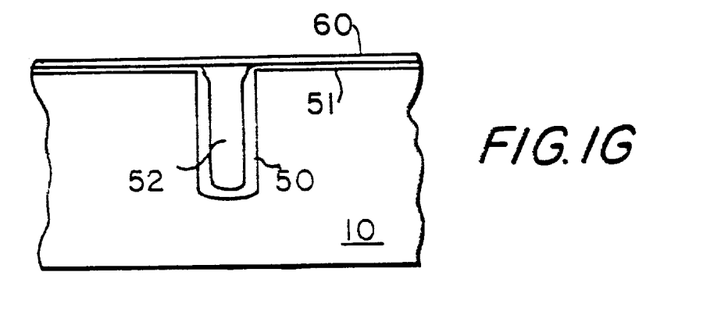

Thereafter, a second liner oxide layer 51 is grown or deposited on the walls of the trench, as well as on the top surface of the substrate, to protect the walls and edge of the trench. The second oxide liner layer 51 is thinner than the first oxide liner and has a thickness of about 900 angstroms, for example. The trench 40 is then filled with polysilicon 52. Typically, about 5 microns, for example, of polysilicon is deposited in the trench as well as on the top surface of the substrate. The polysilicon may be deposited in one step, but is preferably deposited in at least two deposition steps. A planarization etch is then carried out to remove the polysilicon from the top surface of the substrate, as shown in FIG. 1G. Thereafter, a layer 60 of TEOS or low temperature oxide having a thickness of about 6100 angstroms, for example, is then deposited on the top surface of the substrate.

Typically, ion implant and drive in steps that define the diffusion regions of the device, as well as other processing steps, are carried out prior to the trench etching and filling process of the invention. Thus, the TEOS layer 60 can serve as an overlaying insulation layer that insulates the diffusion regions from the subsequently deposited metal contact layer. A photoresist layer (not shown) may be applied atop the TEOS layer 60 and patterned and etched by a masking step, and the TEOS layer etched to form openings to the diffusion regions in the substrate. Thereafter, other process steps may be carried out including the deposition, patterning and etching of a metal layer to interconnect the diffusion regions.

Figure 1H:
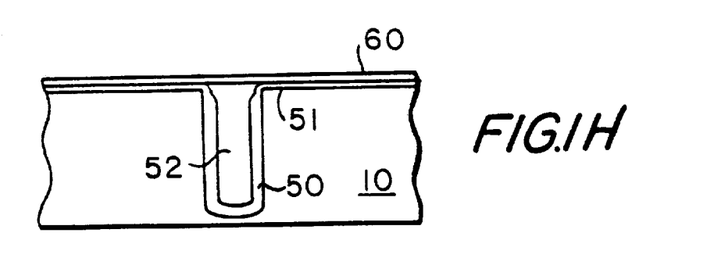
Figure 1I:
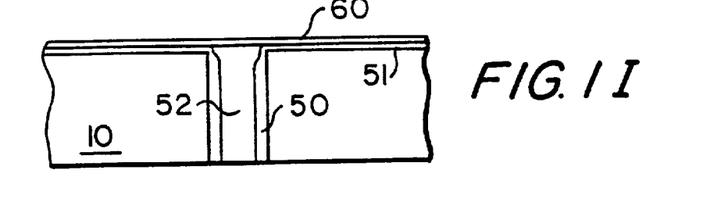

After the completion of processing on the top surface of the wafer, the back surface of the wafer is ground away or otherwise removed until the bottom surface of the trench 40 is reached, as shown in FIG. 1H. A protective transparent coating may be deposited on the top surface of the wafer prior to the back surface removal. A polishing step then removes the bottom wall of the trench including the portion of the first liner oxide 50 that lines the bottom surface of the trench, as shown in FIG. 1I. Typically, about 5 microns of the trench is removed so that, after the polishing step, the remaining wafer has a thickness of about 75 to 125 microns.

Figure 1J:
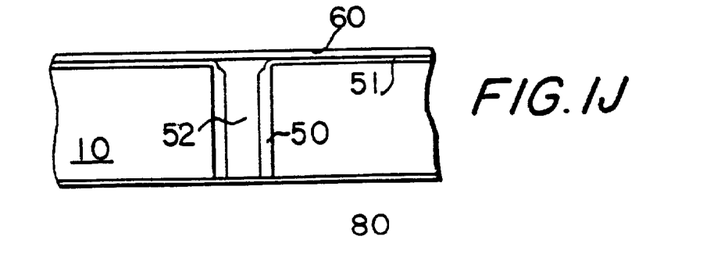

To protect the back side of the wafer, a 1350 angstrom, for example, thick passivation layer 80 of silicon dioxide or another dielectric is deposited on the back side of the wafer, as shown in FIG. 1J.

Figure 1K:
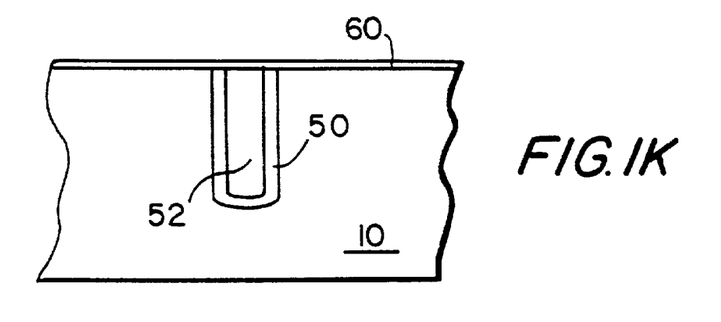
FIGS. 1K–1N show an alternative process in place of the steps shown in FIGS. 1F–1J.
Figure 1L:
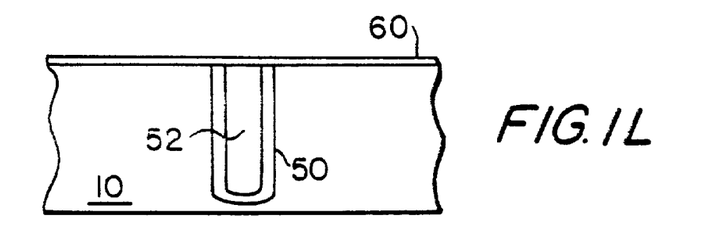
Figure 1M:
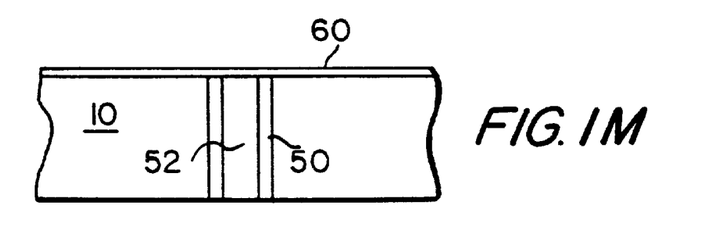
Figure 1N:
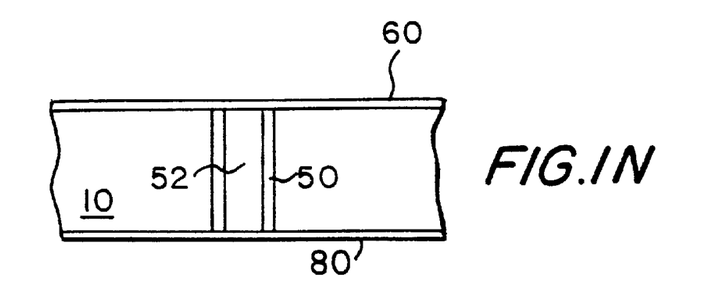

Alternatively, the second liner oxide layer is omitted, and the polysilicon is deposited and then the top portion removed by chemical mechanical polishing until the trench liner oxide 50 appears on the top surface. Thereafter, a layer 60 of TEOS or low temperature oxide having a thickness of about 7000 Angstroms, for example, is deposited on the top surface of the substrate, as FIG. 1K shows, and the back side of the wafer is then processed in the above manner, as shown in FIGS. 1L–1N.

The process of the invention can be applied to the fabrication of any device in which a trench structure is used. For example, the process of the invention is carried out in the manufacture of a photovoltaic generator formed of multiple dielectrically isolated cells in the process shown in FIGS. 2 to 7.

Figure 2:
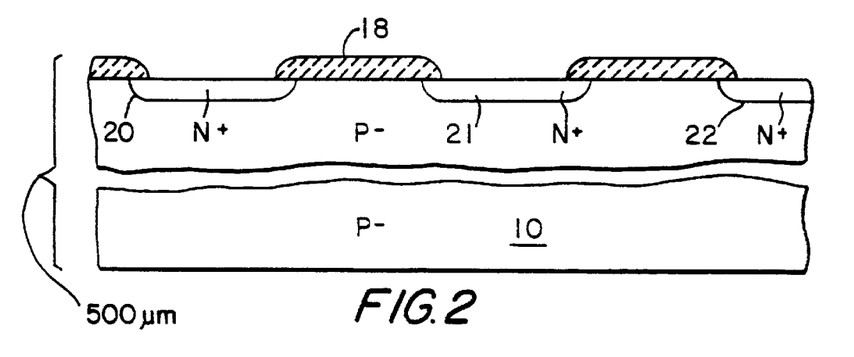
FIG. 2 shows a cross-sectional view of a portion of a device wafer following the diffusion of spaced, shallow N+ regions.
Figure 3:
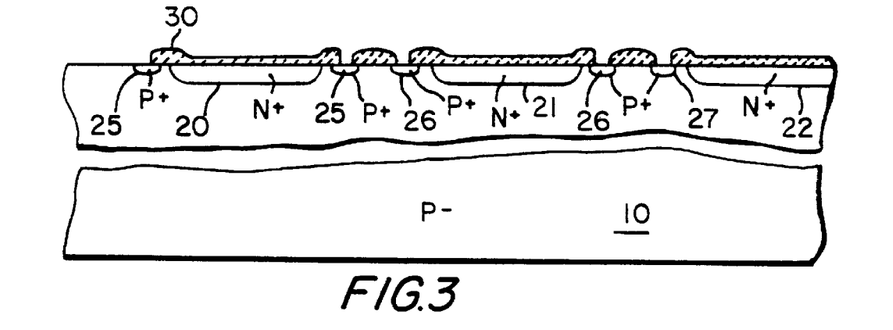
FIG. 3 shows the wafer of FIG. 2 following the diffusion of shallow P+ contact regions.

Referring to FIG. 2, there is shown a cross-section view of a portion of the wafer substrate 10. An implant mask layer, which is typically silicon dioxide is grown atop the front surface of the wafer. Then, using a suitable photolithography technique, a conventional photoresist layer is applied to the top surface of the oxide layer and is patterned to form an array of rectangular or other shaped openings therein. The exposed portions of the oxide is then etched away, and the photoresist is stripped. N− type dopants, such as phosphorous or arsenic, are then implanted into the silicon through the openings in the oxide. The implant is next driven in to form shallow N+ diffusions 20, 21 and 22.

The oxide layer 18 is then removed, and another masking oxide layer 30 is grown atop the front surface of wafer 10. Alternatively, the first oxide layer 18 is removed prior to the drive-in of N+ diffusions 20 to 22, and the second oxide layer 30 is grown concurrent with the drive-in of the N+ diffusions.

A photoresist layer is then deposited atop oxide layer 30 and then patterned to define openings for contact diffusions which are typically ring shaped. The exposed portions of the oxide are then etched, the photoresist is removed and a shallow boron dose is implanted into the exposed silicon surface areas to form P+ contact rings 25, 26 and 27, shown in FIG. 3. Alternatively, a central P+ collecting finger that extends from the P+ rings 25, 26 and 27 can also be disposed at the center of each N+ diffusion. Following the implant step, there is a drive-in of the implant. The oxide layer 30 may be removed either before or after the drive-in step.

It should be noted that the implant energies and doses, as well as the drive-in times and temperatures, can be determined based on the desired dopant distributions using methods known in the art.

Figure 4:
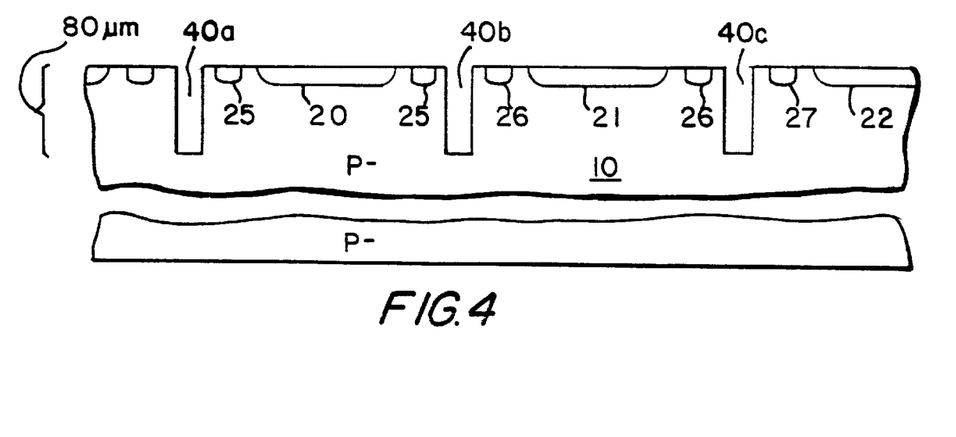
FIG. 4 shows the wafer of FIG. 3 after the formation of isolation trenches which separate and define isolated cells or tubs.

Thereafter, the device is processed according to the invention as shown in FIGS. 1A to 1C, to form a grid of deep trench isolations 40 which surround and isolate each of the P+ contact regions and extend into the silicon substrate 10 to a depth of about 80 to 130 microns. Portions of the trench are shown in FIG. 4 in cross-section as portions 40a, 40b and 40c. The trenches create dielectrically isolated tubs or cells in substrate 10.

Figure 5:
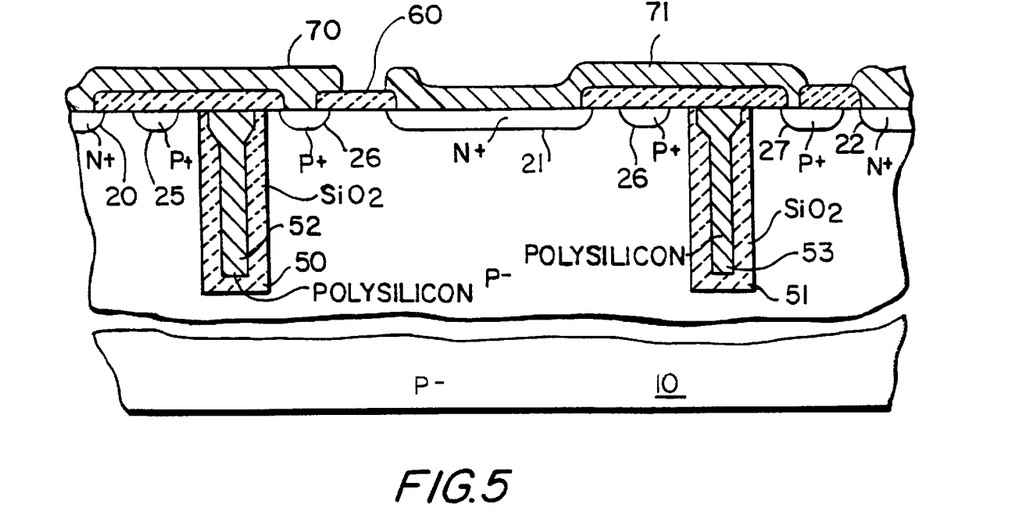
FIG. 5 shows the wafer of FIG. 4 following the formation of oxide layers on the interior walls of the trenches and a polysilicon region within the trenches to dielectrically isolate the cells according to the process of FIGS. 1A to 1J, the deposition and patterning of an overlaying oxide layer, and the deposition and patterning of a contact metal layer.

After the trench array 40 is formed, a first liner oxide layer and a thinner second oxide layer are thermally grown or deposited on the interior walls of the trench and is shown in FIG. 5 as oxide layers 50 and 51. The liner oxide layers are formed in the manner of the invention as shown in FIGS. 1A to 1F. The trenches are then filled with polysilicon 52. In addition to filling the trench, the polysilicon and second liner oxide layers are also deposited on the top of the front surface of the wafer. The polysilicon layer is removed by a chemical mechanical polishing step according to the invention similar to that shown in FIG. 1G. Thus, a plurality of identical dielectrically isolated photovoltaic generator cells is formed in substrate 10. The thickness of the dielectric 50 and 51 is chosen to optimize reflectance of the radiation at the interface with the silicon 10 to improve the efficiency of the device.

Alternatively, the trench is filled by depositing additional layers of silicon dioxide or TEOS.

After forming the dielectrically isolated tubs or cells, an overlaying oxide layer 60 is deposited atop the front surface of the wafer 10. A photolithographic masking step and an etching step are then used to pattern the oxide to form contact openings to the N+ and P+ regions.

Figure 7:
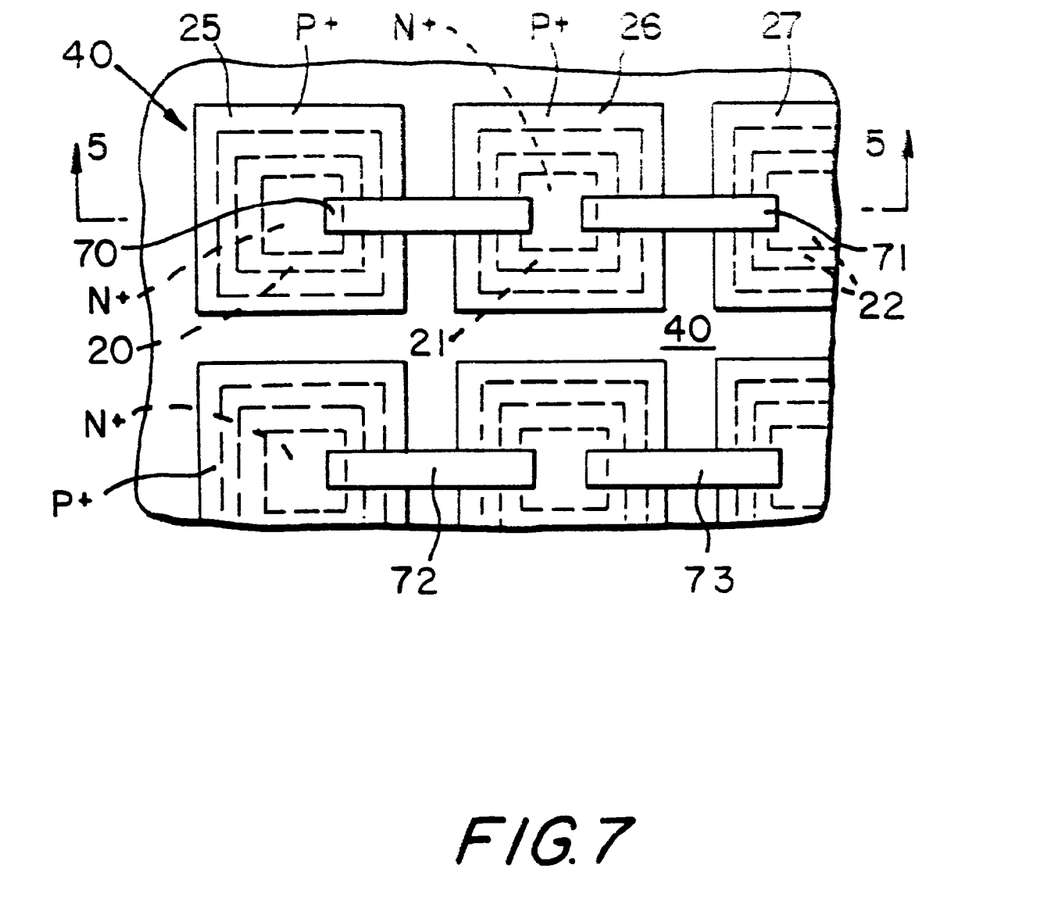
FIG. 7 shows a top view of a portion of the device of FIG. 6 showing the contacts that connect the devices in series.

Thereafter, a contact metal layer is deposited atop the oxide layer 60 and is etched to form contact strips 70, 71, 72 and 73, shown in FIGS. 5 and 7 to connect the N+ diffusion of a cell to the P+ contact diffusion of an adjacent cell.

Figure 6:
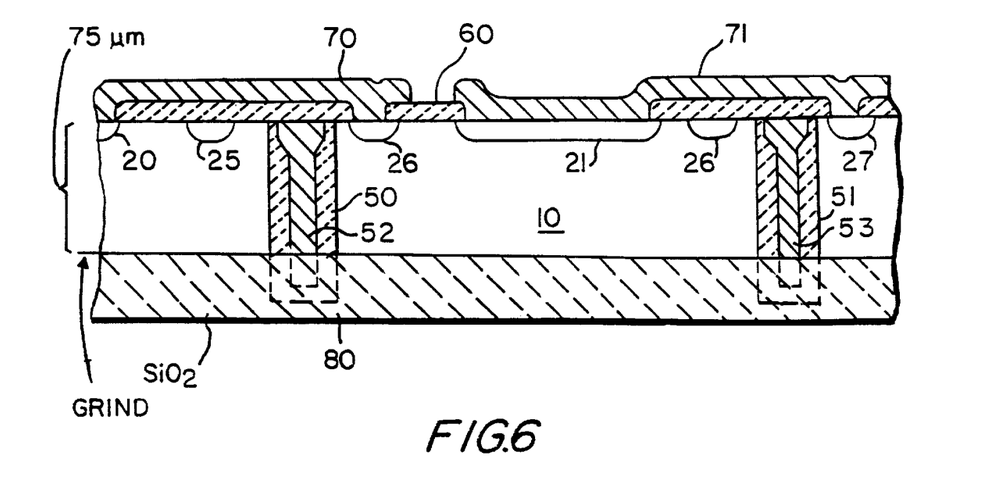
FIG. 6 shows the wafer of FIG. 5 after grinding the back side of the wafer and the formation of an insulating layer on the back side of the wafer according to the process of FIGS. 1A to 1J.

Then, the wafer may be coated with a protective transparent coating. The back surface of the wafer is then ground away until the bottom of trench 40 is removed in the manner shown in FIGS. 1H and 1I. The portion of dielectric layers 50 and 51 that line the bottom of trench 40 may also be removed by removing about 5 microns of the trench. Thus, a wafer having a thickness of between 75 to 125 microns thick remains. Thereafter, a passivation layer 80 of silicon dioxide or other dielectric is deposited on the back side of the wafer in the manner shown in FIG. 1J, as FIG. 6 shows.

The wafer may then be diced into units of a predefined number, typically 16, of series connected cells which have respective solder pad terminals (not shown) to produce devices which can generate a voltage when illuminated by an LED to turn on an MOS-gated power device.

Figure 8:
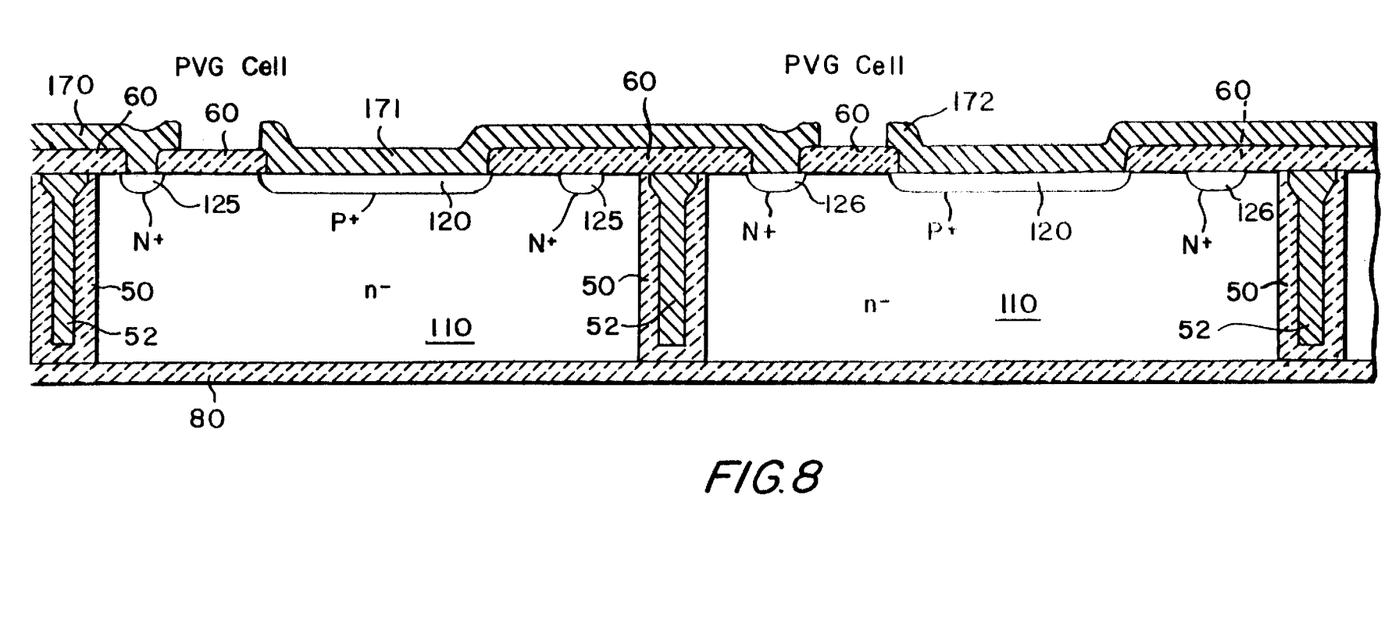
FIG. 8 shows an alternative embodiment of a photovoltaic generator device formed in an N-type substrate according to the invention.

FIG. 8 shows another embodiment of the invention in which an array of rectangular or other shaped shallow P+ diffusion 120 to 122 and substantially square ring shaped N+ contact diffusions 125 to 127 are formed in an N− substrate 110. The P+ diffusions and N+ contact diffusions are first formed in a manner similar to the process shown in FIGS. 2 and 3 except for the substitution of the respective dopants and the corresponding changes in implant dose and energy as well as drive-in time and temperature. The remaining steps of the process are substantially the same as those shown in FIGS. 1A to 1J and FIGS. 4 to 7 as shown by the regions having the same reference numerals in both embodiments representing the same structures. The devices are also interconnected in the manner shown in FIGS. 6 and 7.

Advantageously, the devices shown in FIGS. 2 to 7 and in FIG. 8 are formed using a simple, relatively inexpensive starting wafer, thus reducing the cost of the device. As a further advantage, the more expensive processing steps, namely the trench formation and the trench filling with dielectric and polysilicon, can be formed towards the end of the process after three of the five lithographic steps have been completed and after formation of the P+ and N+ diffusions. Thus, errors in aligning the photolithographic masks and in doping and driving in the diffusions can be detected prior to relatively more expensive trench formation steps.

Figure 9:
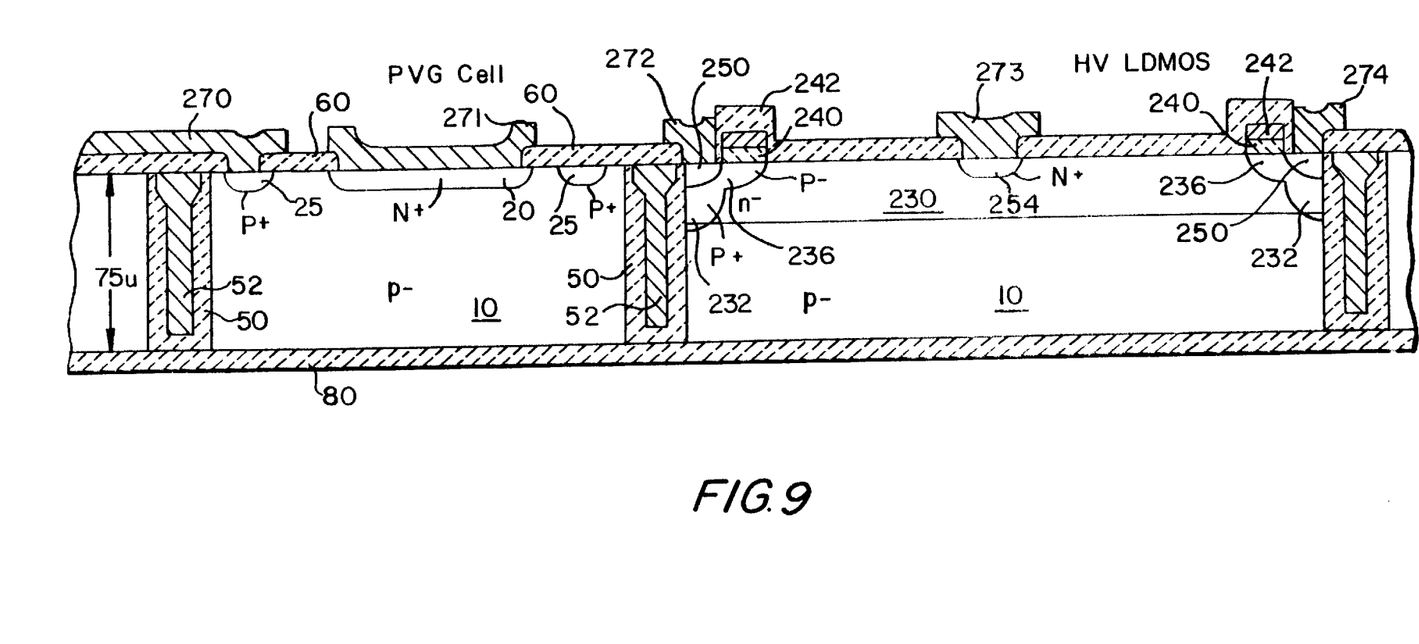
FIG. 9 shows another embodiment of the invention in which a lateral MOSFET is formed in the same substrate as the device of FIG. 6.

FIG. 9 shows another embodiment of the invention in which the photovoltaic generator cells that are formed in the process of FIGS. 1A to 1J and FIGS. 2 to 7 are integrated with a lateral high voltage N channel MOSFET in the same P type substrate and are isolated from each other by the same deep trenches that isolate the respective PVG cells. The PVG cells are connected to the gate of the MOSFET to drive the MOSFET.

The MOSFET is preferably formed of ring-shaped polygonal cells, such as square, rectangular or hexagonal cells, though interdigitated structures may be formed. The N channel MOSFET shown in FIG. 9 may be formed by one of a number of known processes for forming a lateral MOSFET such as, for example, the process described in U.S. application Serial No. (IR-1457).

The MOSFET includes an ultra-deep N-type region 230 formed in the top surface of the substrate. A P-type body region which includes a deeper P+ region 232, as well as more lightly doped shallow P– "shelves" 236 which are surrounded by the deep P+ region 232, are formed in the ultra-deep N-type region 230. An annular N+ source region 250 is formed in the body region and defines a channel region in the top surface of the P– shelves 236. A gate oxide layer 240 and a polysilicon gate layer 242 are disposed atop the channel region and serve as a gate structure for the MOSFET. An N+ annular drain region 254 is also formed in the top surface of the ultra-deep layer 230.

An interlayer TEOS, silicon dioxide or LTO layer 60 is formed on the surface of the chip and includes openings to the N+ source region 250 and the N+ drain region 254 into which source contact electrode 272 and drain contact electrode 273 respectively extend.

It should also be noted that, as a further alternative, the PVG cell can be integrated with a vertical MOSFET in which a further trench is formed at the same time as trench 40 and forms the gate structure of a trench MOSFET. In this embodiment, the thin dielectric layer that is formed on the walls of the trench serves as the gate oxide, and the trenches are filled with doped polysilicon that serves as the gate electrode. The p-shallow shelves are typically omitted and the deep p-type regions are lightly doped to serve as channel regions between the N+ source and drain regions. The passivating oxide is only formed at the back surface beneath the PVG cells and an additional metal contact is formed at the back surface of the wafer adjacent to the vertical MOSFET.

It should also be noted that a similar device can be formed in an N type substrate in which the PVG cell shown in FIG. 8 is integrated with a P channel MOSFET.

Figure 10:
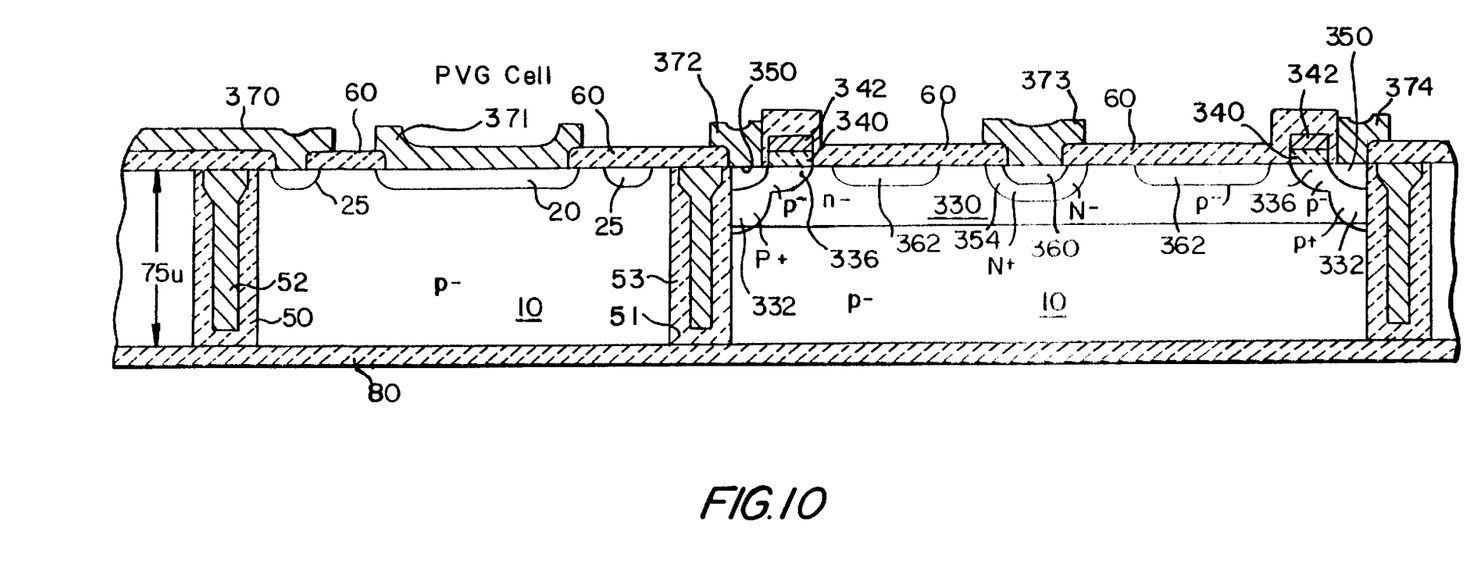
FIG. 10 shows a further embodiment of the invention in which a lateral IGBT is formed in the same substrate as the device of FIG. 6.

FIG. 10 shows a still further embodiment of the invention in which the PVG cells shown in FIGS. 6 and 7 are integrated with and drive a lateral IGBT.

The lateral IGBT includes an ultra-deep N-type region 330 formed in the top surface of the substrate. A P-type body region which includes a deeper P+ region 332, as well as more lightly doped shallow P– "shelves" 336 which surround the deep P+ region 332, are formed in the ultra-deep N-type region 330. An annular N+ source region 350 is formed in the body region and defines a channel region in the P– shelves 336. A gate oxide layer 340 and a polysilicon gate layer 342 are disposed atop the channel region and serve as a gate structure for the MOSFET. An annular N+ region 354 is also formed in the top surface of the ultra-deep layer 330. A P+ collector region 360 is also formed in the N+ region 354.

An interlayer TEOS, silicon dioxide or LTO layer 60 is formed on the surface of the chip and includes openings to the N+ source region 350 and the P+ collector region 356 into which source contact electrode 372 and collector contact electrode 373 respectively extend.

P type resurf region 362 may also be formed in the top surface of the device between the P type body regions and the cathode diffusion.

Alternatively, a vertical IGBT may be integrated with the PVG cells. The collector region is formed at the bottom surface of the wafer and, using appropriate photolithographic steps, a metal contact is formed on the back surface of the IGBT portion of the wafer and the passivating oxide formed on the back surface of the PVG cells.

It should also be noted that one or more MOSFETs or IGBTs can be integrated with the PVG cells of the invention and can be interconnected to form various circuit devices, such as a three-phase bridge, on a single chip.

Moreover, in all of the above devices, a solderable metal layer may be deposited on top of the contact metal layer.

Additionally, any of the above devices can be mounted as a respective chip on a board and may be mounted with an LED insulated therefrom but arranged to produce radiation which illuminates the surface of the wafer or the chip. Any suitable LED can be used.

FIGS. 11A to 11F show another trench process according to the invention in which a trench with a reentrant opening is formed.

Figure 11A:
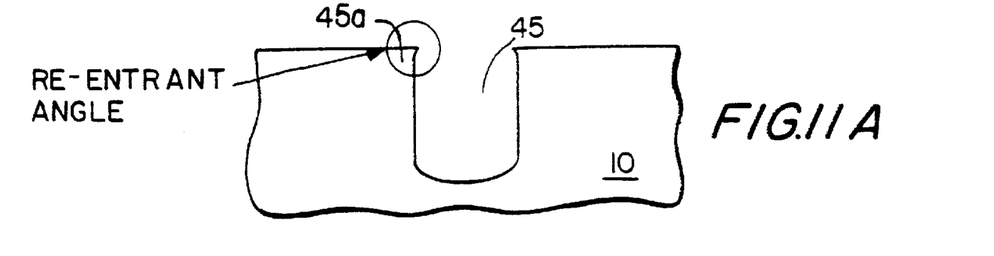
FIGS. 11A–11F show cross-sectional views of a portion of a device wafer in which a re-entrant trench is etched and filled according to another aspect of the invention.

Here, a masking layer is formed and patterned in the manner of the first aspect of the invention, shown in FIG. 1A. The trench etching process, however, leaves a re-entrant portion of the silicon substrate 45a which forms an opening that is narrower at the top of the trench 45 than at the body of the trench as shown in FIG. 11A.

Figure 11B:
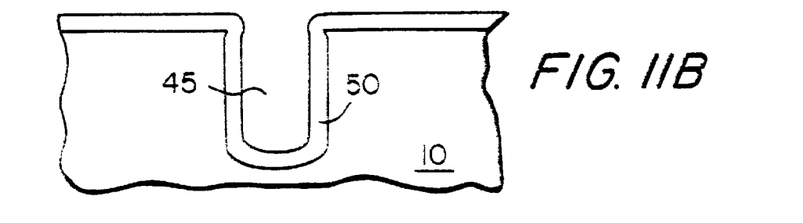
Figure 11C:
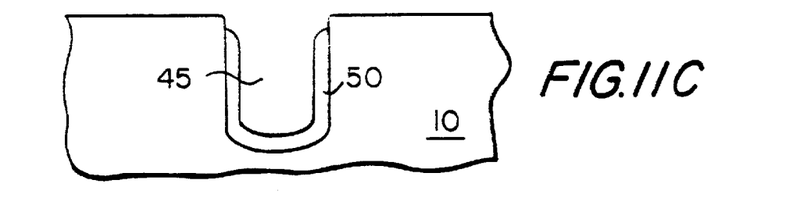
Figure 11D:
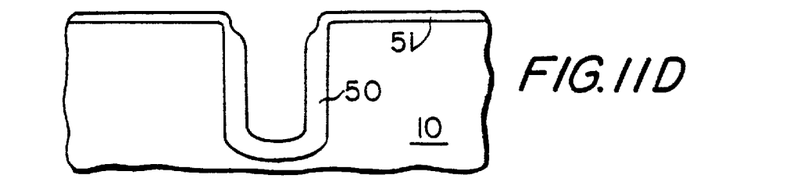
Figure 11E:
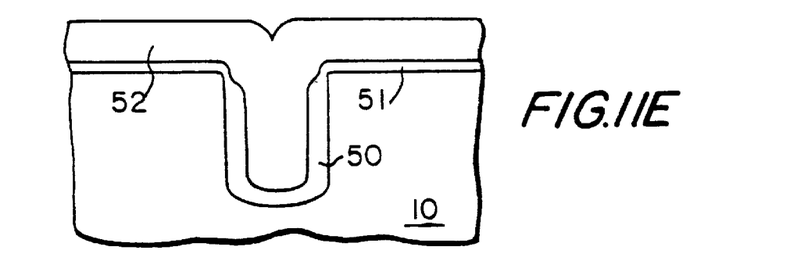
Figure 11F:
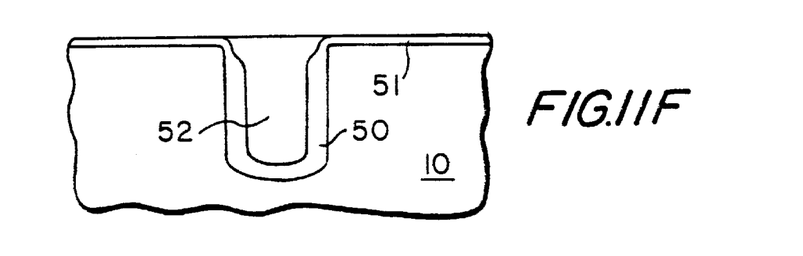

A first liner oxide 50, shown in FIG. 11B, is deposited on the walls and bottom surface of the trench 45, as well as on the top surface of the substrate 10. Then, an anisotropic etch is carried out to remove the oxide from the top surface of the substrate and is further etched to both remove the oxide in the top portion of the trench as well as remove the re-entrant portion of the trench wall, as FIG. 11C shows. A second liner oxide layer 51 is then deposited on the walls of the trench as well as on the top surface of the substrate, as FIG. 11D shows. A polysilicon layer 52 is then deposited that both fills the trench as well as covers the second liner oxide layer 51, as shown in FIG. 11E. A chemical mechanical polish then removes the portion of the polysilicon layer 52 that extends above the top surface of the second oxide layer 51. The resulting structure is shown in FIG. 11F.

Figure 11G:
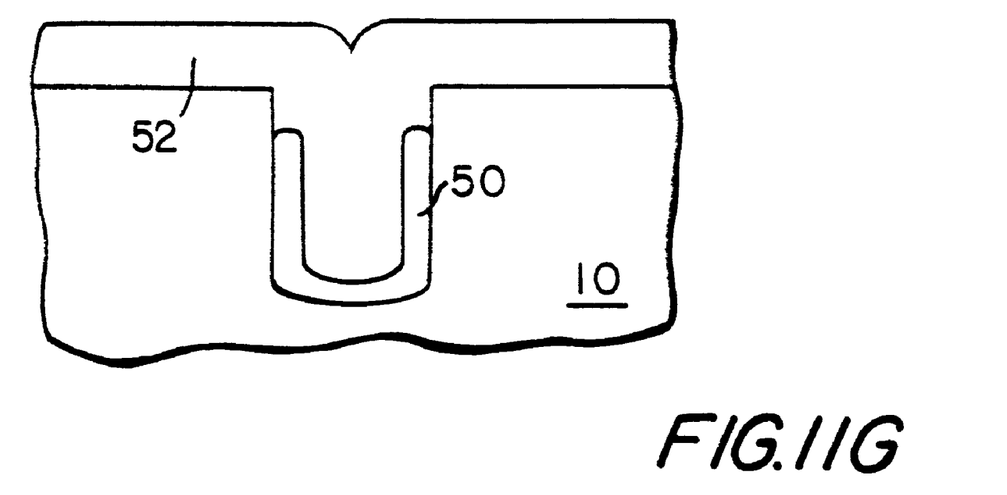
FIGS. 11G–11H show an alternative process in place of the steps shown in FIGS. 11C–11F.
Figure 11H:
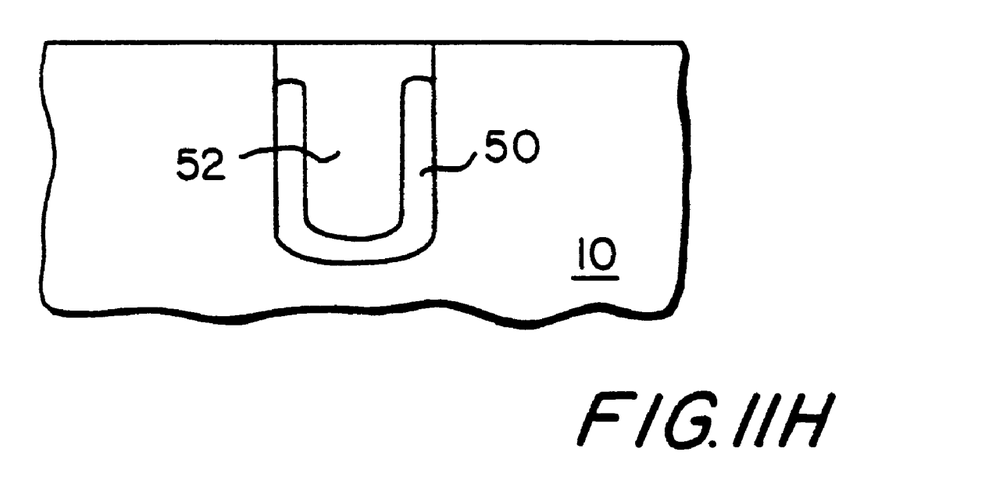

Alternatively, the second liner oxide layer 51 can be omitted, and the polysilicon layer 52 is deposited and then the top portion removed by chemical mechanical polishing until the trench liner oxide layer 50 appears on the top surface, as shown in FIGS. 11G and 11H.

Thereafter, the wafer is processed in the manner described above.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device formed in a silicon substrate of one conductivity type, said device comprising:

a trench formed in said silicon substrate which separates and surrounds each of at least two cells formed in said substrate and which extends from a top surface of said substrate to a bottom surface of said substrate;

a first insulating layer formed only on a lower portion of the walls of said trench structured and arranged so that an upper portion of the walls of said trench remain free of said first insulating layer;

a region of polysilicon formed in said trench and extending from said top surface to said bottom surface of said substrate between said layer of insulating material, thereby filling said trenches;

a region of another conductivity type, which is of opposite conductivity type to said one conductivity type, formed in said top surface of said silicon substrate;

a region of impurities of said one conductivity type formed in said top surface of said substrate and being spaced from and surrounding said region of said another conductivity type;

an overlaying insulation layer formed atop said top surface of said silicon substrate and having at least one opening to said region of said one conductivity type in a respective one of said cells and at least one opening to said region of another conductivity type in another, adjoining one of said cells; and a conductive layer comprising at least one interconnecting contact which connects said region of said one conductivity type of said respective cell and said region of said other conductivity type of said adjoining cell.

2. The device of claim 1 wherein said first insulating layer is selected from the group comprising silicon dioxide and TEOS.

3. The device of claim 1 wherein said overlaying insulation layer is selected from the group comprising silicon dioxide and TEOS.

4. The device of claim 1 further comprising a second insulating layer formed on said top surface of said silicon substrate.

5. The device of claim 1 further comprising a passivation layer formed on said bottom surface of said silicon substrate.

6. The device of claim 5 wherein said passivation layer is silicon dioxide.

7. The device of claim 1 wherein at a further one of said cells is comprised of an MOS gated semiconductor device comprising:

a layer of said another conductivity type formed in said top surface of said substrate;

a contact region of said another conductivity type formed in said top surface and being more heavily doped than said layer of said another conductivity type;

a body region of said one conductivity type formed in said top surface and being spaced from and surrounding said contact region;

a source region of said another conductivity type formed in a portion of said body region at said top surface and defining a channel region in said top surface between said source region and said layer;

a gate electrode disposed atop said top surface and overlaying and being insulated from said channel region and being operable to invert said channel region in response to a suitable gate voltage supplied thereto;

said overlaying insulation layer being formed atop said layer on said top surface of said silicon substrate and atop said gate electrode and having at least one opening to said source region and at least one opening to said contact region; and at least one source contact formed of said conductive layer in said opening to said source region and at least one drain contact formed of said conductive layer in said opening to said contact region.

8. The device of claim 7 wherein said source region and said body region adjoin and are surrounded by said trench.

9. The device of claim 1 wherein at least one of said cells is comprised of an MOS gated semiconductor device comprising:

a layer of said another conductivity type formed in said top surface of said substrate;

a contact region of said another conductivity type formed in said top surface and being more heavily doped than said layer of said another conductivity type;

an anode region of said one conductivity type formed in said contact region at said top surface;

a body region of said one conductivity type formed in said top surface and being spaced from and surrounding said contact region;

a source region of said another conductivity type formed in a portion of said body region at said top surface and defining a channel region in said top surface between said source region and said layer;

a gate electrode disposed atop said top surface and overlaying and being insulated from said channel region and being operable to invert said channel region in response to a suitable gate voltage supplied thereto;

said overlaying insulation layer being formed atop said layer on said top surface of said silicon substrate and atop said gate electrode and having at least one opening to said source region and at least one opening to said anode region; and at least one source contact formed of said conductive layer in said opening to said source region and at least one anode contact formed of said conductive layer in said opening to said anode region.

10. The device of claim 9 wherein said source region and said body region adjoin and are surrounded by said trench.

11. The device of claim 1 further comprising a second insulating layer, which is thinner than said first insulating layer, formed on an upper portion of the walls of said trench.

* * * * *